United States Patent [19]
Mori et al.

[11] Patent Number: 4,922,098
[45] Date of Patent: * May 1, 1990

[54] ELECTRON MICROSCOPE

[75] Inventors: Nobufumi Mori; Yuichi Hosoi; Junji Miyahara, all of Kanagawa, Japan

[73] Assignee: Fuji Photo Film Co., Ltd., Kanagawa, Japan

[ * ] Notice: The portion of the term of this patent subsequent to Dec. 26, 2006 has been disclaimed.

[21] Appl. No.: 259,427

[22] Filed: Oct. 11, 1988

Related U.S. Application Data

[63] Continuation of Ser. No. 787,094, Oct. 15, 1985, abandoned.

[30] Foreign Application Priority Data

Oct. 18, 1984 [JP] Japan .................................. 59-218858

[51] Int. Cl.$^5$ ...................... H01J 37/147; H01J 37/26
[52] U.S. Cl. .................................. 250/311; 250/327.2; 250/397
[58] Field of Search ................. 250/310, 311, 327.2 C, 250/337, 397, 484.1 B

[56] References Cited

U.S. PATENT DOCUMENTS 3,857,035 12/1974 Miller .................................... 250/338
3,859,527 1/1975 Luckey .............................. 250/327.2
4,206,349 6/1980 Kamimura ........................... 250/311
4,426,583 1/1984 Chang et al. ......................... 250/398
4,485,304 11/1984 Teraoka et al. ................... 250/327.2

Primary Examiner—Constantine Hannaher
Attorney, Agent, or Firm—Sixbey, Friedman, Leedom & Ferguson

[57] ABSTRACT

An electron microscope has a two-dimensional sensor located at the image-formation plane. The two-dimensional sensor stores electron beam energy and emits light upon exposure to light or heat. The filament is located at a position displaced from the principal optical axis of the electron beam so that the image of the filament may not be recorded on the two-dimensional sensor. The two-dimensional sensor is, for example, made of stimulable phosphor.

2 Claims, 1 Drawing Sheet

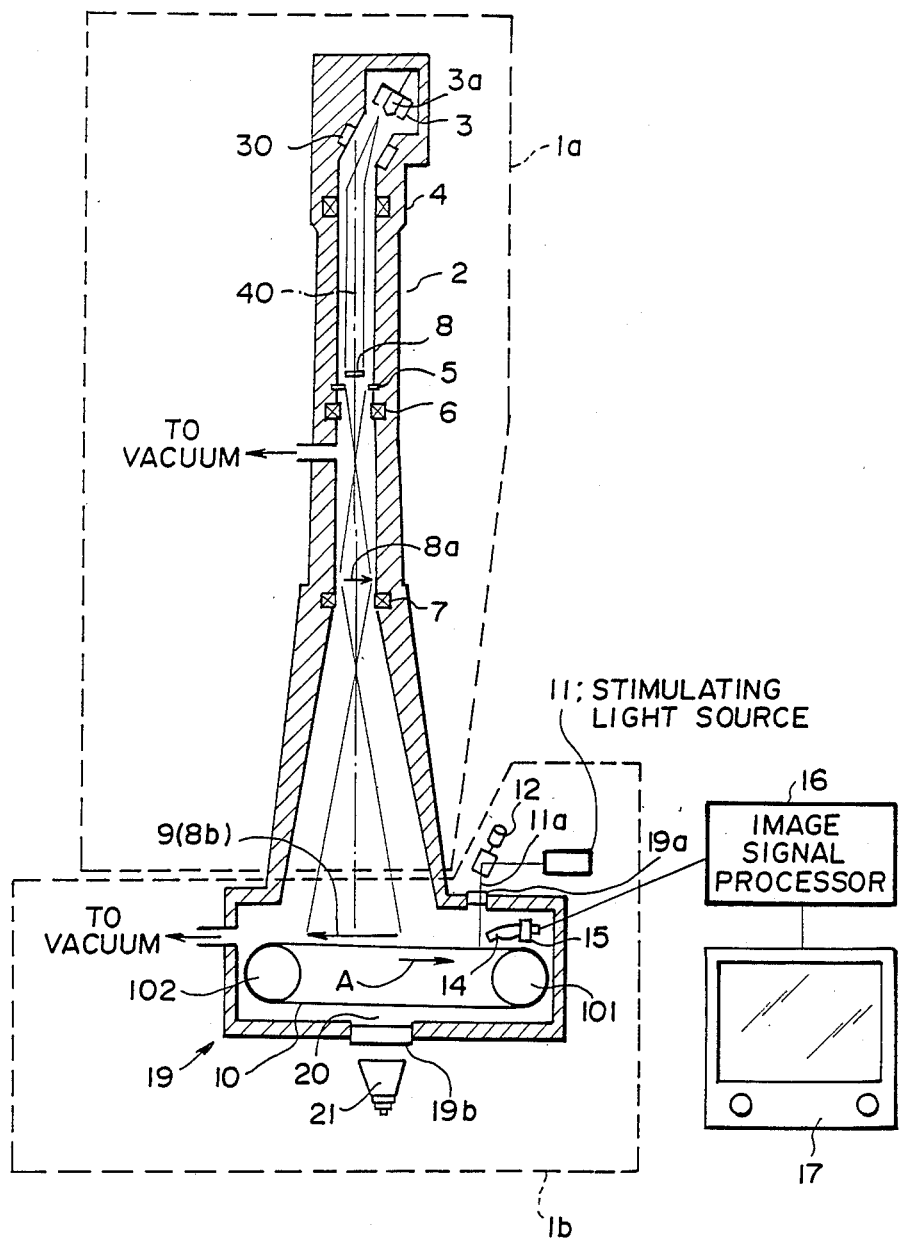

ELECTRON MICROSCOPE

This application is a continuation of Ser. No. 787,094, filed 10/15/85, now abandoned.

BACKGROUND OF THE INVENTION

1. Field of the Invention

The present invention relates to a device for recording images produced by an electron microscope, and more particularly to an image recording device capable of recording electron microscope images with high sensitivity and of reproducing the recorded electron microscope images in the form of electric signals wherein the image quality is improved.

2. Description of the Prior Art

There are known electron microscopes for obtaining a magnified image of a specimen by deflecting a beam of electrons transmitted through the specimen with an electric or magnetic field. As is well known, the electron beam having passed through the specimen forms a diffraction pattern on the rear focal plane of the objective lens, and the diffracted beams interfere with each other again to produce the magnified image of the specimen. The magnified specimen image can be observed as a scattered-light image by projecting the image onto a screen with a projector lens. Alternatively, the rear focal plane of the objective lens may be projected for enabling the user to observe the magnified diffraction pattern of the image. Where an intermediate lens is positioned between the objective lens and the projector lens, the magnified scattered-light image or the diffraction pattern may be produced selectively as desired by adjusting the focal length of the intermediate lens.

The magnified image or the diffraction pattern (hereinafter referred to collectively as a transmitted electron-beam image) may be observed in different manners. For example, one general practice has been to place a photographic film on the image formation plane for exposure to the transmitted electron-beam image. According to another design, an image intensifier is employed to amplify the transmitted electron-beam image for projection. The use of photographic films is however disadvantageous in that their sensitivity to electron beams is low and the process of developing the films is complex. The image intensifier also has drawbacks in that the images produced thereby have poor sharpness and are likely to become distorted.

SUMMARY OF THE INVENTION

In view of the aforesaid problems of the prior electron microscope image recording devices, it is an object of the present invention to provide an image recording device capable of recording and reproducing electron microscope images with high sensitivity and quality.

According to the present invention, there is provided a device for recording images produced by an electron microscope, comprising a sensor supply unit for supplying a two-dimensional sensor capable of storing electron beam energy, a recorder for holding the two-dimensional sensor on the image formation plane of the electron microscope and for recording an electron beam image transmitted through a specimen on the two-dimensional sensor, a sensor receiving unit for accommodating the two-dimensional sensor having recorded the electron beam image thereon, a sensor feed means for feeding the two-dimensional sensor from the sensor supply unit to the recorder, a sensor delivery means for delivering the two-dimensional sensor from the recorder to the sensor receiving unit after the electron beam image has been recorded on the two-dimensional sensor in the recorder, and an erase means disposed between the sensor supply unit and the recorder for heating or irradiating the two-dimensional sensor with light to discharge residual radiation energy stored in the two-dimensional sensor, characterized in that the filament for emitting thermoelectrons is located at a position displaced from the principal optical axis of of the electron beam.

The two-dimensional sensor may preferably be in the form of a stimulable phosphor sheet disclosed in Japanese Unexamined Patent Publication Nos. 55-12429, 55-116,340, 55-163,472, 56-11395, and 56-104,645, for example. A certain phosphor, when exposed to a radiation such as an electron beam, stores a part of the energy of the radiation. When the phosphor exposed to the radiation is exposed to stimulating rays such as visible light, the phosphor emits light (stimulated emission) in proportion to the stored energy of the radiation. Such a phosphor is called a stimulable phosphor, and the stimulable phosphor sheet is generally composed of a support and a stimulable phosphor layer disposed on the support. The stimulable phosphor layer may be formed by dispersing the stimulable phosphor in a suitable binder. However, the stimulable phosphor layer may itself be a stimulable phosphor sheet if it is self-supporting.

The two-dimensional sensor may also be in the form of a thermoluminescent phosphor sheet as revealed in Japanese Patent Publication Nos. 55-47719 and 55-47720, for example. The thermoluminescent phosphor sheet emits stored radiation energy as thermoluminescence when heat is applied to the sheet. The thermoluminescent phosphor sheet may be constructed in the same manner as the stimulable phosphor sheet.

The two-dimensional sensor is placed on the image formation plane of the electron microscope, and the electron microscope image is recorded on the two-dimensional sensor by the electron beam transmitted through the specimen. Then, as disclosed in Japanese Patent Application No. 59-150,175, the two-dimensional sensor on which the electron microscope image is stored is exposed to stimulating rays such as visible light or is heated to enable the sensor to emit the stored electron beam energy as light. The emitted light is then photoelectrically read to produce an electric signal indicative of the transmitted electron-beam image. The electric image signal thus generated may be employed to display the electron microscope image on a display unit such as a CRT, or to record the electron microscope image permanently as a hard copy, or to store the electron microscope image on a recording medium such as a magnetic tape, a magnetic disk, or the like.

In the electron microscope using the above-described two-dimensional sensor, it sometimes occurs that an image of the filament for emitting thermoelectrons located on the principal optical axis of the electron beam in the upper portion of the lens barrel of the electron microscope is recorded on the two-dimensional sensor, probably because of its high sensitivity. This is considered to be caused by radiations or ultraviolet rays emitted from the filament beside the electron beam. Such a phenomenon appears only when the two-dimensional sensor as described above is used and is not observed when the conventional photographic film is used.

In view of the above phenomenon, a further object of the present invention is to provide an electron microscope free of said phenomenon and recording an image of high quality.

The electron microscope according to the present invention is characterized in that the filament for emitting an electron beam is located at a position displaced from the principal optical axis of the electron beam, i.e. the optical axis of the converging lens, objective lens and projection lens. Since the filament is displaced from the principal optical axis, the image of the filament is not recorded on the two-dimensional sensor.

The stimulable phosphor employed in the stimulable phosphor sheet according to the present invention may comprise phosphors expressed by the composition formulas: SrS:Ce, Sm; SrS:Eu, Sm; ThO$_2$:Er; and La$_2$O$_2$S:Eu, Sm, as disclosed in U.S. Pat. No. 3,859,527.

The stimulable phosphor may also comprise phosphors expressed by the composition formulas: ZnS:Cu,Pb; BaO.xAl$_2$O$_3$:Eu [where $0.8 \leq x \leq 10$]; and $M^{II}$O xSiO$_2$:A [where $M^{II}$ is Mg, Ca, Sr, Zn, Cd, or Ba; A is Ce, Tb, Eu, Tm, Pb, Tl, Bi, or Mx; and $0.5 \leq x \leq 2.5$], as disclosed in Japanese Unexamined Patent Publication No. 55(1980)-12142.

The stimulable phosphor may also comprise phosphors expressed by the composition formula: (Ba$_{1-x-y}$, Mg$_x$, Ca$_y$)FX:aEu$^{2+}$ [where X is at least one of Cl and Br; $0 < x+y \leq 0.6$, $xy \neq 0$, and $10^{-6} \leq a \leq 5 \times 10^{-2}$], as disclosed in Japanese Unexamined Patent Publication No. 55(1980)-12143.

The stimulable phosphor may also comprise phosphors expressed by the composition formula: LnOX:xA [where Ln is at least one of La, Y, Gd, and Lu; X is at least one of Cl and Br; A is at least one of Ce and Tb; and $0 < x < 0.1$], as disclosed in Japanese Unexamined Patent Publication No. 55(1980)-12144.

The stimulable phosphor may also comprise phosphors expressed by the composition formula: (Ba$_{1-x}$, $M^{II}{}_x$)FX:yA [where $M^{II}$ is at least one of Mg, Ca, Sr, Zn, and Cd, X is at least one of Cl, Br, and I; A is at least one of Eu, Tb, Ce, Tm, Dy, Pr, Ho, Nd, Yb, and Er; $0 \leq x \leq 0.6$, and $0 \leq y \leq 0.2$], as disclosed in Japanese Unexamined Patent Publication No. 55(1980)-12145.

The stimulable phosphor may also comprise phosphors expressed by the composition formula: $M^{II}$FX.xA:yLn [where $M^{II}$ is at least one of Ba, Ca, Sr, Mg, Zn, and Cd; A is at least one of BeO, MgO, CaO, SrO, BaO, ZnO, Al$_2$O$_3$, Y$_2$O$_3$, La$_2$O$_3$, SiO$_2$, TiO$_2$, ZrO$_2$, GeO$_2$, SnO$_2$, Nb$_2$O$_5$, Ta$_2$O$_5$, and ThO$_2$; Ln is at least one of Eu, Tb, Ce, Tm, Dy, Pr, Ho, Nd, Yb, Er, Sm, and Gd; X is at least one of Cl, Br, and I; $5 \times 10^{-5} < x < 0.5$, and $0 < y < 0.2$], as disclosed in Japanese Unexamined Patent Publication No. 55(1980)-160,078.

The stimulable phosphor may also comprise phosphors expressed by the composition formula: (Ba$_{1-x}$, $M^{II}{}_x$)F$_2$.aBaX$_2$:yEu$^{2+}$, zA [where $M^{II}$ is at least one of beryllium, magnesium, calcium, strontium, zinc, and cadmium; X is at least one of chlorine, bromine, and iodine; A is at least one of zirconium and scandium; $0.5 \leq a \leq 1.25$, $0 \leq x \leq 1$, $10^{-6} \leq y \leq 2 \times 10^{-1}$, and $0 < z \leq 10^{-2}$], as disclosed in Japanese Unexamined Patent Publication No. 56(1981)-116,777.

The stimulable phosphor may also comprise phosphors expressed by the composition formula: (Ba$_{1-x}$, $M^{II}{}_x$)F$_2$.aBaX$_2$:yEu$^{2+}$, zB [where $M^{II}$ is at least one of beryllium, magnesium, calcium, strontium, zinc, and cadmium; X is at least one of chlorine, bromine and iodine; $0.5 \leq a \leq 1.25$, $0 \leq x \leq 1$, $10^{-6} \leq y \leq 2 \times 10^{-1}$, and $0 < z \leq 10^{-1}$], as disclosed in Japanese Unexamined Patent Publication No. 57(1982)-23673.

The stimulable phosphor may also comprise phosphors expressed by the composition formula: (Ba$_{1-x}$, $M^{II}{}_x$)F$_2$.aBaX$_2$:yEu$^{2+}$, zA [where $M^{II}$ is at least one of beryllium, magnesium, calcium, strontium, zinc, and cadmium; X is at least one of chlorine, bromine, and iodine; A is at least one of arsenic and silicon; $0.5 \leq a \leq 1.25$, $0 \leq x \leq 1$, $10^{-6} \leq y \leq 2 \times 10^{-1}$, and $0 < z \leq 5 \times 10^{-1}$], as disclosed in Japanese Unexamined Patent Publication No. 57(1982)-23675.

The stimulable phosphor may also comprise phosphors expressed by the composition formula: (Ba$_{1-x}$ M$_{x/2}$ L$_{x/2}$) FX:yEu$^{2+}$ [where M is at least one alkaline metal selected from the group consisting of Li, Na, K, Rb, and Cs; L is at least one trihydric metal selected from the group consisting of Sc, Y, La, Ce, Pr, Nd, Pm, Sm, Gd, Tb, Dy, Ho, Er, Tm, Yb, Lu, Al, Ga, In, and Tl; X is at least one halogen selected from the group consisting of Cl, Br, and I; $10^{-2} \leq x \leq 0.5$, and $0 < y \leq 0.1$], as disclosed in Japanese Unexamined Patent Publication No. 58(1983)-206,678.

The stimulable phosphor may also comprise phosphors expressed by the composition formula: BaFX.xA:yEu$^{2+}$ [where X is at least one halogen selected from the group consisting of Cl, Br, and I; A is a calcined tetrafluoroboric compound; $10^{-6} \leq x \leq 0.1$, and $0 < y \leq 0.1$], as disclosed in Japanese Unexamined Patent Publication No. 59(1984)-27980.

The stimulable phosphor may also comprise phosphors expressed by the composition formula: BaFX.xA:yEu$^{2+}$ [where X is at least one halogen selected from the group consisting of Cl, Br, and I; A is at least one calcined compound selected from the group consisting of the salts of monohydric or dihydric metals of hexafluorosilicic acid, hexafluorotitanic acid, and hexafluorozirconic acid; $10^{-6} \leq x \leq 0.1$, and $0 < y \leq 0.1$], as disclosed in Japanese Unexamined Patent Publication No. 59(1984)-47289.

The stimulable phosphor may also comprise phosphors expressed by the composition formula: BaFX.xNaX':aEu$^{2+}$ [where each of X and X' is at least one of Cl, Br, and I; $0 < x \leq 2$, and $0 < a \leq 0.2$], as disclosed in Japanese Unexamined Patent Publication No. 59(1984)-56479.

The stimulable phosphor may also comprise phosphors expressed by the composition formula: $M^{II}$FX.xNaX':yEu$^{2+}$ [where $M^{II}$ is at least one alkaline earth metal selected from the group consisting of Ba, Sr, and Ca; each of X and X' is at least one halogen selected from the group consisting of Cl, Br, and I; A is at least one transition metal selected from the group consisting of V, Cr, Mn, Fe, Co, and Ni; $0 < x \leq 2$, $0 < y \leq 0.2$, and $0 < z \leq 10^{-2}$], as disclosed in Japanese Unexamined Patent Publication No. 59(1984)-56480.

The stimulable phosphor may also comprise phosphors expressed by the composition formula: $M^{II}$FX.aM$^I$X'.bM$^{II}$X''$_2$.cM$^{III}$X'''$_3$.xA:YEu$^{2+}$ [where $M^{II}$ is at least one alkaline earth metal selected from the group consisting of Ba, Sr, and Ca; M$^I$ is at least one alkaline metal selected from the group consisting of Li, Na, K, Rb, and Cs; M'$^{II}$ is at least one dihydric metal selected from the group consisting of Be and Mg; M$^{III}$ is at least one trihydric metal selected from the group consisting of Al, Ga, In, and Tl; A is a metal oxide; X is at least one halogen selected from the group consisting of Cl, Br, and I; X', X'', and X''' are at least one halogen selected from the group consisting of F, Cl, Br, and I; $0 \leq a \leq 2$, $0 \leq b \leq 10^{-2}$, $0 \leq c \leq 10^{-2}$, and $a+b+c \geq 10^{-6}$; $0 < x \leq 0.5$ and $0 < y \leq 0.2$], as disclosed in Japanese Unexamined Patent Publication No. 59(1984)-75200 filed by the present applicant.

The stimulable phosphor may also comprise phosphors expressed by the composition formula: $M^{II}X_2 \cdot aM^{II}X'_2 : xEu^{2+}$ [where $M^{II}$ is at least one alkaline earth metal selected from the group consisting of Ba, Sr, and Ca; X and X' are at least one halogen selected from the group consisting of Cl, Br, and I with $X \neq X'$; $0.1 \leq a \leq 10.0$ and $0 < x \leq 0.1$], as disclosed in Japanese Patent Application No. 58(1983)-193,161 (U.S. patent application Ser. No. 834,886) now abandoned in favor of No. 07/336,553.

The stimulable phosphor which can be employed in the present invention is however not limited to the aforesaid phosphors, but may be any phosphor capable of photoluminescence upon exposure to stimulating light after it has been irradiated with a radiation.

Preferred thermoluminescent phosphors that can be used in the present invention include compounds produced by adding a small amount of at least one of Mn, Dy, and Tm to sulphuric compounds such as $Na_2SO_4$, $MnSO_4$, $CaSO_4$, $SrSO_4$, and $BaSO_4$.

The phosphor sheet may additionally have a protective layer and a light-reflecting or light-absorbing undercoated layer. The phosphor layer of the phosphor sheet may be colored with a pigment or a dye as disclosed in Japanese Unexamined Patent Publication No. 55(1980)-163,500.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

The single FIGURE is a vertical cross-sectional view of a device for recording images produced by an electron microscope according to an embodiment of the present invention.

DESCRIPTION OF THE PREFERRED EMBODIMENTS

The FIGURE shows an electron microscope according to the present invention. The electron microscope is provided with, under a lens barrel portion 1a of the same structure as that of the conventional electron microscope, a recorder/reader assembly 1b which is composed of a stimulable phosphor sheet 10 serving as a two-dimensional image sensor, a stimulating means for scanning the stimulable phosphor sheet 10 with stimulating light while the stimulable phosphor sheet 10 is placed under vacuum, and a detector means for photoelectrically detecting luminescent light emitted by the stimulable phosphor sheet 10. The stimulable phosphor sheet 10 and the image-formation plane 9 of the electron microscope are positioned in one vacuum chamber at least when the stimulable phosphor sheet 10 is exposed to an electron beam for recording an image thereon. The interior of the lens barrel 1a and the interior of the vacuum chamber are kept under vacuum by any known means such as a vacuum pump while the electron microscope is in operation.

The lens barrel 1a houses an electron gun 3 having a filament 3a for emitting an electron beam 2 at a constant speed located at a position displaced from the principal optical axis of the electron beam 2 indicated by a chain line, at least one convergent lens 4 comprising a magnetic lens or an electrostatic lens for converging the electron beam 2 toward a specimen 8, an electron beam deflecting means 30, a specimen support 5, an objective lens 6 identical to the convergent lens 4, and a projector lens 7. The thermoelectron emitted from the filament 3a is deflected by the electron beam deflecting means 30 to advance along the principal optical axis, and passes through the specimen 8 placed on the specimen support 5, and then is refracted by the objective lens 6 to form a magnified scattered-light image 8a of the specimen 8. The scattered-light image 8a is focused by the projector lens 7 as an image 8b on the image-formation plane 9.

In the above-described structure, the electron gun 3 having the filament 3a is provided at the postion displaced from the principal optical axis to such an extent that the electron gun 3 cannot be directly observed from anywhere on the image-formation plane 9.

The stimulable phosphor sheet 10 in the recorder/reader 1b is in the form of an endless belt trained around a cylindrical driver roller 101 and a cylindrical driven roller 102 spaced horizontally from each other. The stimulating means has a stimulating light source 11 comprising an He - Ne laser or a semiconductor laser for emitting a stimulating light beam 11a and a light deflector 12 such as a galvanometer mirror for deflecting the stimulating light beam 11a transversely across the sheet 10 to scan the same. The vacuum chamber is defined by a casing 19 communicating with the lens barrel 1a and having a light-transmissive wall member 19a made as of lead glass and through which the stimulating light beam 11a passes from the light deflector 12 toward the sheet 10. The detector means includes a light collecting body 14 for collecting light emitted from the sheet 10 through a filter which cuts the stimulating rays, and a photoelectric transducer 15 such as a photomultiplier coupled to the exit end of the light collecting body 14 for detecting the emitted luminescent light through a filter which removes the stimulating light to produce a corresponding electric signal. The stimulable phosphor sheet 10 is composed of a flexible endless-belt support and a stimulable phosphor layer deposited on the outer surface of the endless-belt support. The endless-belt stimulable phosphor sheet 10 is driven to run in the direction of the arrow A when the driver roller 101 is rotated by a drive unit such as a motor.

The endless-belt stimulable phosphor sheet 10, the driver roller 101, the driven roller 102, the light-collecting body 14, and the photoelectric transducer 15 are disposed in the vacuum chamber. However, the exit end of the light collecting body 14 may project out of the casing 19 so that the photoelectric transducer 15 may be disposed outside the vacuum chamber.

In operation, a shutter (not shown) positioned between the lens barrel 1a and the recorder/reader 1b is opened to expose the portion of the stimulable phosphor sheet 10 located in the image-formation plane 9 to an electron beam which bears the scattered-light image 8b of the specimen 8 for thereby storing the electron beam energy on the sheet 10. Then, the driver roller 101 is rotated to move the exposed portion of the sheet 10 toward a read-out section. The exposed portion of the sheet 10 is scanned transversely (primary scanning) by the stimulating light beam 11a deflected by the light deflector 12 and transmitted through the light-transmissive wall member 19a, while at the same time the sheet 10 is continuously moved in the direction of the arrow A so that the sheet 10 is scanned longitudinally (secondary scanning). Therefore, the stimulable phosphor sheet 10 is two-dimensionally scanned by the stimulating light beam 11a. Light which is emitted from the sheet 10 upon exposure to the stimulating light beam 11a enters the light collecting body 14 through its incident end and travels therethrough while being subject to total reflection therein. The light is then detected by the photoelectric transducer 15 which photoelectrically converts the amount of light into an electric signal.

The electric signal generated by the photoelectric transducer 15 is processed by an image signal processor 16, and processed signal is fed to an image reproducer 17 such as a CRT display. Therefore, the magnified scattered-light image 8b borne by the light emitted from the sheet 10 can be reproduced.

After the image has been read from the sheet 10, the exposed portion thereof is fed to an erasing zone 20 where erasing light emitted from an erase light source 21 such as a fluorescent lamp disposed outside of the casing 19 is radiated onto the sheet 10 through a light-transmissive wall member 19b supported on the casing 19. The erasing light is in the same wavelength region as that of the stimulating light for the stimulable phosphor sheet 10. Therefore, upon exposure to the erasing light from the erase light source 21, any remanent image stored in the phosphor layer of the sheet 10 and noise arising from a radioactive element such as $^{226}$Ra contained as impurities in the phosphor layer can be discharged from the sheet 10. The erase light source 21 may comprise a tungsten lamp, halogen lamp, an infrared lamp, a xenon flash lamp, or a laser source, as disclosed in Japanese Unexamined Patent Publication No. 56(1981)-11392.

The principles of the present invention can be employed for recording and reproducing the diffraction pattern of a specimen. The recorded diffraction pattern can be read in the same manner as described with reference to the FIGURE, and the read image can be displayed on the CRT or printed as a hard copy.

A recorded pattern or recorded information is determined by the recorded condition of a transmitted electron-beam image recorded on the stimulable phosphor sheet 10, the nature of the specimen 8, and the manner of recording the image. For eliminating any adverse effect arising from varied recording conditions or for obtaining an electron microscope image which can clearly be observed, such recorded information should be obtained prior to the reproduction of a visible image by which the specimen can be observed. The read-out gain (read-out condition) should be adjusted or the image-dependent signal should be processed by the obtained recorded information. Furthermore, the generation of a reproduced image which can effectively be observed requires that a scale factor (latitude: read-out condition) be determined in order to optimize the resolution of the reproduced image dependent on the contrast of the recorded pattern.

One way of obtaining the recorded information on the sheet 10 before a visible image is produced for observing the specimen 8 is disclosed in Japanese Unexamined Patent Publication No. 58(1983)-89245. More specifically, prior to the generation of a visible image for observing the specimen 8 (main reading mode), the recorded information stored in the stimulable phosphor sheet 10 is read (advance reading mode) with stimulating light having a lower energy than that of stimulating light to be applied in the main reading mode. Based on the recorded information thus obtained, the read-out gain is suitably adjusted or a scale factor is determined for the main reading mode, or the signal generated in the main reading mode is processed.

The photoelectric detector means 14, 15 may comprise a solid-state photoelectric transducer rather than the photomultiplier (see Japanese Patent Application Nos. 58(1983)-86226, 58(1983)-86227, 58(1983)-219,313, and 58(1983)-219,314, and Japanese Unexamined Patent Publication No. 58(1983)-121,874). A plurality of solid-state photoelectric transducer elements may be disposed in covering relation to the entire surface of the stimulable phosphor sheet 10, or may be located closely to the sheet 10. The photoelectric detector means may also comprise a line sensor composed of an array of solid-state photoelectric transducer elements, or a single solid-state photoelectric transducer element corresponding to one pixel and movable to scan the entire surface of the sheet 10.

The source 11 of stimulating light may comprise an array of light-emitting diodes or semiconductor lasers for preventing a loss of light emitted from the sheet 10 and for allowing the detector means to detect emitted light at a larger angle for an increased S/N ratio. The electric signal generated by the detector means can be read out at a high speed since the signal is rendered time-dependent by electric processing in the detector means, not by time-dependent application of the stimulating light.

The stimulable phosphor sheet may comprise a thermofluorescent phosphor sheet. For discharging the stored energy from the thermofluorescent phosphor sheet, the sheet may be scanned by thermal radiation emitted from a heat source such as a $CO_2$ laser source. For more details, reference should be made to Japanese Patent Publication No. 55(1980)-47720.

After the image has been recorded on the stimulable phosphor sheet 10, the vacuum in the vacuum chamber may be removed, the sheet 10 may be taken out of the vacuum chamber, and the image stored therein may be read by an image reader separate from the electron microscope. However, where the stimulable phosphor sheet 10 is repeatedly used in the vacuum chamber as illustrated, a number of images can successively be recorded and reproduced without changing stimulable phosphor sheets.

The image recording device of the present invention is highly advantageous for the following reasons:

Since an electron microscope image is recorded on a high-sensitivity two-dimensional sensor in the form of a stimulable phosphor sheet, for example, the electron microscope image can be recorded with high sensitivity, so that the intensity of the electron beam for exposing the two-dimensional sensor can be lowered and hence exposure-induced damage to the specimen can be reduced.

The recorded electron microscope image is reproduced directly as an electric signal, which can be processed in various ways such as tone processing, frequency emphasis, etc. By processing the electric signal with a computer, various image processing modes such as the processing of a diffraction pattern, the reconstruction of a three-dimensional image, and the digitization of an image can easily and quickly be effected.

Since the two-dimensional sensor for recording electron microscope images can be reused through exposure to erasing light or heat, electron microscope images can be recorded more economically than would be with the conventional silver-salt photographic system.

Further, in the electron microscope according to the present invention, since the filament for emitting thermoelectrons is located at a position displaced from the principal optical axis of the electron beam, the image of the filament is not recorded on the two-dimensional sensor and an electron microscope image of high quality can be obtained.

We claim:

1. An electron microscope of the transmission type in combination with a two-dimensional sensor for recording an electron beam image, comprising: a two-dimensional sensor located on an image-formation plane, said two-dimensional sensor comprising a stimulable phosphor sheet which stores electron beam energy and where the sensitivity of the stimulable phosphor sheet to said electron beam is greater than that of a photographic film such that a lower amount of the electron beam can be used to minimize damage to a specimen in the electron microscope and where, upon exposure to stimulating light, the stored energy of the electron beam image is released as light to be photo-electrically detected, and an electron microscope having a filament for emitting thermoelectrons, said filament being located at a position displaced from the principal optical axis of the electron beam.

2. A device for recording images produced by an electron microscope, comprising in combination:
   (i) a sensor supply means for supplying a two-dimensional sensor, the two-dimensional sensor comprising a stimulable phosphor sheet which is capable of storing electron beam energy where the sensitivity of said stimulable phosphor sheet to the electron beam energy is greater than that of a photographic film such that a lower amount of the electron beam energy can be used to minimize damage to specimen on the stimulable phosphor sheet;
   (ii) a recorder for holding the two-dimensional sensor on the image formation plane of the electron microscope and for recording an electron beam image transmitted through said specimen on the two-dimensional sensor;
   (iii) a sensor receiving means for accommodating the two-dimensional sensor having recorded thereon the electron beam image;
   (iv) a sensor feed means for feeding the two-dimensional sensor from said sensor supply means to said recorder;
   (v) a sensor delivery means for delivering the two-dimensional sensor from said recorder to said sensor receiving means after the electron beam image has been recorded on the two-dimensional sensor in said recorder;
   (vi) an erase means disposed between said sensor supply unit and said recorder for irradiating the two-dimensional sensor with light to discharge residual radiation energy stored in the two-dimensional sensor, and
   (vii) an electron gun having a filament for emitting thermoelectrons which is located at a position displaced from the principal optical axis of the electron beam.

* * * * *